US010600739B1

(12) United States Patent
Herrault et al.

(10) Patent No.: US 10,600,739 B1
(45) Date of Patent: Mar. 24, 2020

(54) INTERPOSER WITH INTERCONNECTS AND METHODS OF MANUFACTURING THE SAME

(71) Applicant: HRL LABORATORIES, LLC, Malibu, CA (US)

(72) Inventors: Florian G. Herrault, Agoura Hills, CA (US); Zak C. Eckel, Thousand Oaks, CA (US); Tobias A. Schaedler, Oak Park, CA (US); Robert Mone, Boston, MA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/059,943

(22) Filed: Aug. 9, 2018

Related U.S. Application Data

(60) Provisional application No. 62/564,892, filed on Sep. 28, 2017.

(51) Int. Cl.
| | | |
|---|---|---|
| *H01L 23/538* | (2006.01) | |
| *H01L 21/48* | (2006.01) | |
| *H01L 23/15* | (2006.01) | |
| *H01L 23/50* | (2006.01) | |
| *H01L 23/498* | (2006.01) | |
| *H01L 23/00* | (2006.01) | |
| *B29C 64/10* | (2017.01) | |
| *H05K 1/03* | (2006.01) | |

(52) U.S. Cl.
CPC .......... *H01L 23/5389* (2013.01); *B29C 64/10* (2017.08); *H01L 21/486* (2013.01); *H01L 23/15* (2013.01); *H01L 23/49816* (2013.01); *H01L 23/50* (2013.01); *H01L 24/17* (2013.01); *H05K 1/0306* (2013.01); *H01L 2224/16235* (2013.01); *H01L 2924/15311* (2013.01); *H01L 2924/15331* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,541,222 A | * | 11/1970 | Kitaguchi | H01L 23/5384 174/260 |
| 3,795,037 A | * | 3/1974 | Luttmer | H01R 12/714 29/883 |
| 5,371,654 A | * | 12/1994 | Beaman | G01R 1/07307 174/16.3 |

(Continued)

OTHER PUBLICATIONS

Eckel et al., "Addictive manufacturing of polymer-derived ceramics," Science, 351(6268): 58-62, Jan. 2016.

(Continued)

*Primary Examiner* — William H. Mayo, III
*Assistant Examiner* — Krystal Robinson
(74) *Attorney, Agent, or Firm* — Lewis Roca Rothgerber Christie, LLP (57) ABSTRACT

An interposer includes an interposer substrate having a series of vias, and a series of metallic interconnects in the series of vias. The interposer substrate has a first surface and a second surface opposite the first surface. The interposer substrate includes a dielectric material. A first pitch of the series of vias at a first end of the series of vias is different than a second pitch of the series of vias at a second end of the series of vias.

21 Claims, 5 Drawing Sheets

(56) References Cited

U.S. PATENT DOCUMENTS

| | | | | |
|---|---|---|---|---|
| 5,585,675 | A * | 12/1996 | Knopf | H01L 23/481 257/686 |
| 5,785,538 | A * | 7/1998 | Beaman | G01R 1/07357 439/66 |
| 6,774,315 | B1 * | 8/2004 | Pierson | H01L 23/49827 174/261 |
| 7,213,330 | B2 * | 5/2007 | Caldwell | H01L 24/10 29/832 |
| 7,390,740 | B2 * | 6/2008 | Wark | H01L 21/486 257/E21.597 |
| 7,897,503 | B2 * | 3/2011 | Foster | B81B 7/0006 438/618 |
| 8,623,753 | B1 * | 1/2014 | Yoshida | H01L 25/105 257/686 |
| 9,165,907 | B2 * | 10/2015 | Jakob | H01L 25/0657 |
| 9,418,926 | B1 * | 8/2016 | Fay | H01L 23/49827 |
| 9,449,943 | B2 * | 9/2016 | Lin | H01L 21/568 |
| 9,741,694 | B2 * | 8/2017 | Yu | H01L 21/6835 |
| 9,831,155 | B2 * | 11/2017 | Lin | H01L 23/481 |
| 9,997,452 | B1 * | 6/2018 | Uchiyama | H01L 27/10844 |
| 10,062,668 | B2 * | 8/2018 | Pagani | H01L 23/481 |
| 10,163,861 | B2 * | 12/2018 | Yu | H01L 25/0657 |
| 2002/0084509 | A1 * | 7/2002 | Ballantine | H01L 23/5227 257/531 |
| 2006/0046475 | A1 * | 3/2006 | Wark | H01L 21/486 438/667 |
| 2008/0099952 | A1 * | 5/2008 | Fork | B81C 99/0015 264/173.16 |
| 2012/0103679 | A1 * | 5/2012 | Yamamoto | H01L 23/49827 174/264 |
| 2015/0002256 | A1 * | 1/2015 | Bourns | H01F 27/2804 336/84 M |
| 2018/0240691 | A1 * | 8/2018 | Flitsch | H01L 21/67161 |
| 2019/0110367 | A1 * | 4/2019 | Gavagnin | H05K 1/119 |

OTHER PUBLICATIONS

Wang et al., "Lightweight Mechanical Metamaterials with Tunable Negative Thermal Expansion," American Physical Society, 117, 175901, 6 pages, Oct. 2016.

Zenou et al., "Laser jetting of femto-liter metal droplets for high resolution 3D printed structures," Scientific Reports, 5:17265, 10 pages, Nov. 25, 2015.

* cited by examiner

INTERPOSER WITH INTERCONNECTS AND METHODS OF MANUFACTURING THE SAME

CROSS-REFERENCE TO RELATED APPLICATION(S)

The present application claims priority to and the benefit of U.S. Provisional Application No. 62/564,892, filed Sep. 28, 2017, the entire content of which is incorporated herein by reference.

FIELD

The present disclosure relates generally to interposers.

BACKGROUND

Interposers are electrical interface routing devices utilized to connect one socket, such as a sensor array, to a second socket, such as an integrated circuit. Interposers are configured to spread the electrical connection to a wider pitch and/or to reroute the electrical connection to accommodate sockets having different pitches and/or different electrical connection configurations.

Figure 1:
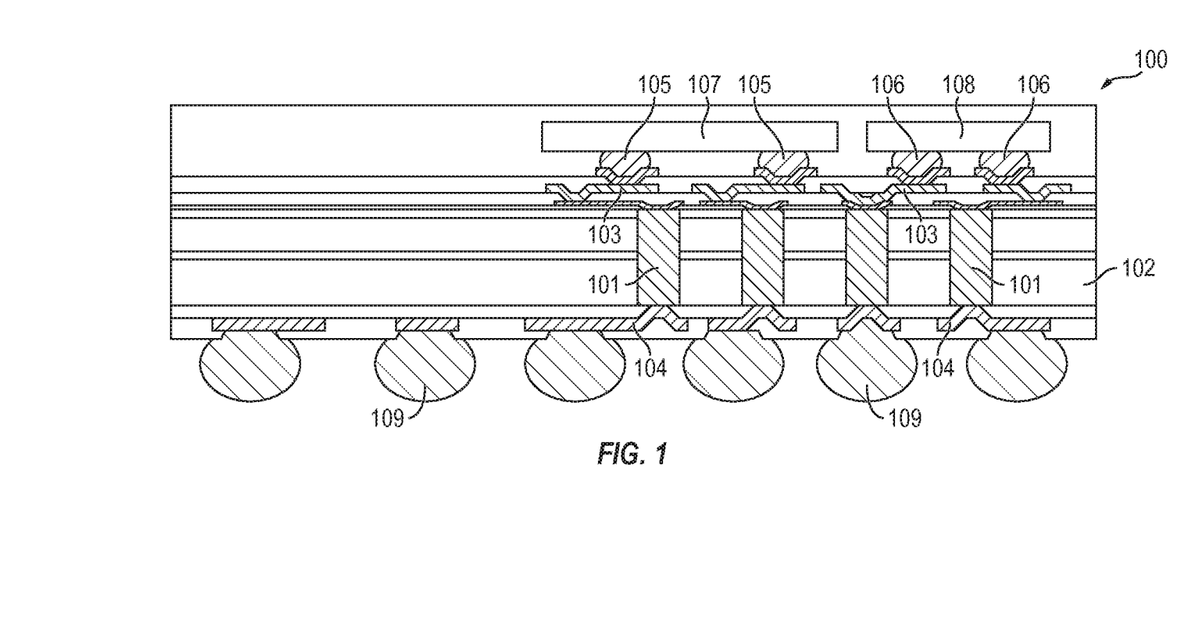
FIG. 1 is a cross-sectional view of a related art interposer.

As illustrated in FIG. 1, related art interposers 100 utilize a series of straight, vertical metal vias 101 extending through a silicon interposer substrate 102, and a series of multi-layer interconnects 103, 104 extending laterally on upper and lower surfaces, respectively, of the interposer substrate 102. The interconnects 103 on the upper surface of the interposer substrate 102 are connected by micro-bumps 105, 106 to a first die 107 and a second die 108, respectively, and the interconnects 104 on the lower surface of the interposer substrate 102 are connected to a ball grid array (BGA) 109 configured to mount to an integrated circuit. Additionally, the metal vias 101 in related art interposers typically have a single common diameter. Accordingly, with related art interposers, routing of the interconnects is possible only by utilizing multi-layer boards or multiple layers of metal/dielectric on silicon wafers.

SUMMARY

The present disclosure is directed to various embodiments of an interposer. In one embodiment, the interposer includes an interposer substrate having a series of vias, and a series of metallic interconnects in the series of vias. The interposer substrate has a first surface and a second surface opposite the first surface. The interposer substrate includes a dielectric material. A first pitch of the series of vias at a first end of the series of vias is different than a second pitch of the same series of vias at a second end of the series of vias.

The first pitch of the series of vias may be at the first surface of the interposer substrate and the second pitch of the series of vias may be at the second surface of the interposer substrate.

The series of metallic interconnects may be slanted at angles relative to the first surface of the interposer substrate, and the angles at which the series of metallic interconnects are slanted relative to the first surface of the interposer substrate may vary between the plurality of metallic interconnects. The angle of at least one metallic interconnect of the series of metallic interconnects may vary non-uniformly. The angle of one metallic interconnect of the series of metallic interconnects proximate to a center of the interposer substrate may be approximately (about) 90 degrees. The angles of the series of metallic interconnects may decrease with increasing distance from the center of the interposer substrate. The angles may decrease uniformly from the approximately (about) 90 degrees to approximately (about) 10 degrees. The angles may decrease non-uniformly. The angles may increase non-uniformly. The angles may increase or decrease in all three spatial directions (i.e., x-, y-, and z-directions).

At least a portion of one metallic interconnect of the series of metallic interconnects is spiral-shaped. A first metallic interconnect of the series of metallic interconnects proximate to a center of the interposer substrate may be oriented at an angle of approximately (about) 90 degrees relative to the first surface, and a second metallic interconnect of the series of metallic interconnects may include a bend at an intermediate position between the first and second surfaces of the interposer substrate. The bend extends in a direction away from the first metallic interconnect. The second metallic interconnect may include a first segment extending from the first surface to the bend, and a second segment extending from the bend to the second surface. The first segment may be substantially orthogonal to the first surface, and the second surface may be substantially orthogonal to the second surface. The first segment may be slanted relative to the first surface, or the second segment may be slanted relative to the second surface. The bend may be substantially parallel to the first and second surfaces.

At least one of the series of metallic interconnects has a first diameter at the first surface and a second diameter greater than the first diameter at the second surface. The second diameter may be from approximately (about) 10% to approximately (about) 100% greater than the first diameter.

The interposer substrate may have a thickness from approximately (about) 0.3 mm to approximately (about) 5 mm, and a diameter of each of the plurality of metallic interconnects may be from approximately (about) 1 μm to approximately (about) 1000 μm.

The dielectric material of the interposer substrate may be dielectric glass, ceramic, or polymer.

The present disclosure is also directed to various methods of manufacturing an interposer. In one embodiment, the method includes forming an interposer substrate having a series of vias. The interposer substrate has a first surface and a second surface opposite the first surface, and the interposer substrate includes a dielectric material. The method also includes forming a series of metallic interconnects in the series of vias. A first pitch of the series of vias at a first end of the series of vias is different than a second pitch of the series of vias at a second end of the series of vias.

The first pitch of the plurality of vias may be at the first surface of the interposer substrate and the second pitch of the plurality of vias may be at the second surface of the interposer substrate.

Forming the interposer substrate may include three-dimensional printing a mold, casting a dielectric material in the mold, and removing the mold.

Forming the series of metallic interconnects may include three-dimensional printing the series of metallic interconnects, and forming the interposer substrate may include casting or molding a dielectric around the series of metallic interconnects.

Forming the interposer substrate may include three-dimensional printing the interposer substrate from a pre-ceramic polymer resin by stereolithography or digital light processing, and pyrolyzing the pre-ceramic polymer resin into a glass ceramic material. In one embodiment, forming the interposer substrate may include a thermal crystallization task.

Forming the series of metallic interconnects may be performed by atomic layer deposition, electroless plating, electroplating, electroforming from a conductive substrate, injection of a metallic paste, and/or metal melt infiltration.

Forming the series of metallic interconnects may include metal melt infiltration of a conductive material such as solder, braze, silver-copper (Ag—Cu) eutectic, or pure silver.

Forming the interposer substrate and forming the series of metallic interconnects may be performed simultaneously or concurrently by a multi-material additive manufacturing process. The multi-material additive manufacturing process may be micro-extrusion, aerosol jet printing, and/or laser induced forward transfer.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

The present disclosure is directed to various embodiments of interposers and methods of manufacturing interposers. The interposers according to one or more embodiments of the present disclosure include angled vias and metallic interconnects in the vias, such as slanted vias and metallic interconnects, spiraled vias and metallic interconnects, and/or vias and metallic interconnects with bends. In one or more embodiments, the configuration of the vias and the metallic interconnects, such as the angle of the vias and the metallic interconnects and/or the lengths of bends, varies across the interposer. Angled vias and metallic interconnects provide increased electrical connection pitch without the utilization of separate multi-layer interconnects, which are typically utilized in related art interposers.

The methods of manufacturing the interposers according to various embodiments of the present disclosure include manufacturing an interposer substrate out of dielectric glass, polymer, and/or ceramic. In one or more embodiments, the ceramic interposer substrate may be manufactured by three-dimensional (3-D) printing the interposer substrate from a pre-ceramic polymer resin and then pyrolyzing the pre-ceramic polymer resin to convert it to a dense ceramic material. Forming a ceramic interposer substrate enables the utilization of high-temperature techniques for the formation of the metallic interconnects, such as metal melt infiltration. The methods according to one or more embodiments of the present may include forming the metallic interconnects by atomic layer deposition (ALD) followed by electroless plating or electroplating, electroforming from a conductive substrate, and/or conductive paste infiltration.

Figure 2A:
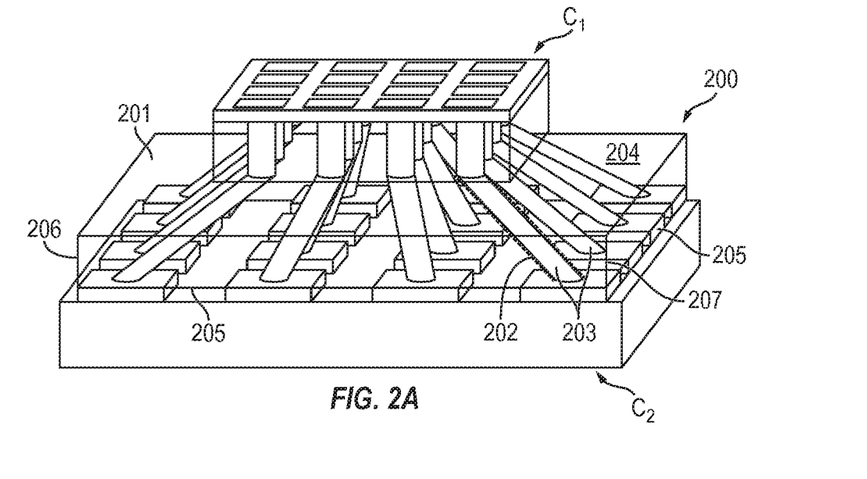
FIGS. 2A and 2B are a perspective view and a side view, respectively, of an interposer according to one embodiment of the present disclosure having slanted vias.
Figure 2B:
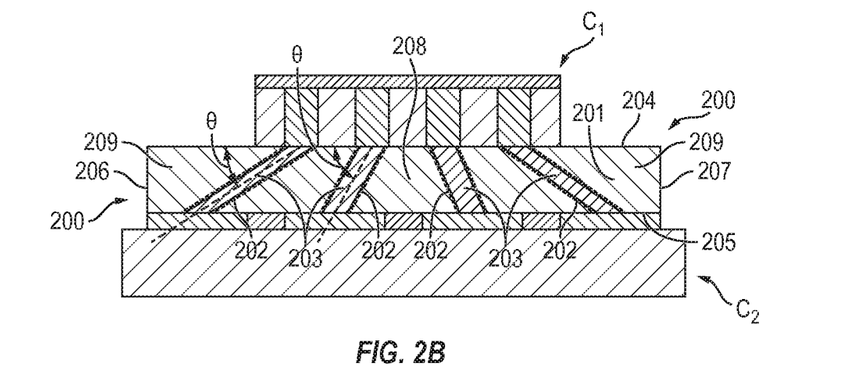

With reference now to FIGS. 2A-2B, an interposer 200 according to one embodiment of the present disclosure includes an interposer substrate 201 defining a series of vias 202, and a series of metallic interconnects 203 in (e.g., extending through) the vias 202. In one or more embodiments, the interposer substrate 201 is formed from a dielectric material, such as, for instance, dielectric glass, ceramic, or polymer. The interposer substrate 201 includes a first surface 204 (e.g., an upper surface) configured to be connected to a first chip $C_1$ (e.g., a sensor array, such as an infrared focal plane array (IR FPA), or a millimeter wave (mm-W) phased array) and a second surface 205 (e.g., a lower surface) opposite the first surface 204 configured to be connected to at least one second chip $C_2$ (e.g., at least one read-out integrated circuit (ROIC)). In one or more embodiments, the interposer substrate 201 may have a thickness measured between the first and second surfaces 204, 205 from approximately (about) 0.3 mm to approximately (about) 5 mm. In one or more embodiments, the interposer substrate 201 may have an area of approximately (about) 0.1 $cm^2$ to approximately (about) 150 $cm^2$. The metallic interconnects 203 may be formed of any material having suitable electrical conductivity, such as, for instance, highly conductive solders (e.g., tin-silver-copper), highly conductive brazes, silver-copper (Ag—Cu), or pure or substantially pure silver (Ag).

With continued reference to the embodiment illustrated in FIGS. 2A-2B, the vias 202, and the metallic interconnects 203 therein, are slanted (e.g., angled) relative to the first and second surfaces 204, 205 of the interposer substrate 201. In one or more embodiments, the vias 202 and the metallic interconnects 203 are slanted outward (e.g., toward one of the vertical sidewalls 206, 207 of the interposer substrate 201) such that a first pitch of the vias 202 and the metallic interconnects 203 at the first surface 204 is smaller than a second pitch of the vias 202 and the metallic interconnects 203 at the second surface 205 (e.g., the spacing between adjacent vias 202 and adjacent metallic interconnects 203 is closer at the first surface 204 than at the second surface 205). In this manner, the vias 202 and the metallic interconnects 203 contained therein fan out from a relatively smaller-pitch at the first surface 204 to a relatively larger-pitch at the second surface 205 such that the interposer 200 may be utilized to connect chips $C_1$, $C_2$ having different pitches. In one or more embodiments, the vias 202 and the metallic interconnects 203 may be slanted at an angle $\theta$ from approximately (about) 10 degrees to approximately (about) 90 degrees with respect to the first surface 204 of the interposer substrate 201. In the illustrated embodiment, the angle $\theta$ is defined as the interior angle between the vias 202 and the corresponding metallic interconnects 203 and the first surface 204. Additionally, in one or more embodiments, at least one of the vias 202 and at least one corresponding metallic interconnect 203 located in a center or central portion 208 of the interposer substrate 201 may be angled at an angle $\theta$ of approximately (about) 90 degrees with respect to the first surface 204 (e.g., one or more vias 202 and corresponding metallic interconnects 203 located in the center or central portion 208 of the interposer substrate 201 may be orthogonal or substantially orthogonal to the first surface 204).

Figure 5A:
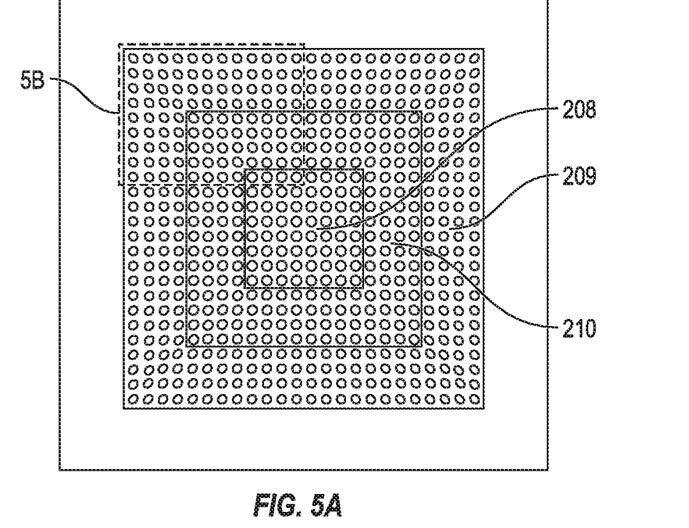
FIGS. 5A-5B are a bottom view and a detailed view, respectively, of an interposer according to one embodiment of the present disclosure.
Figure 5B:
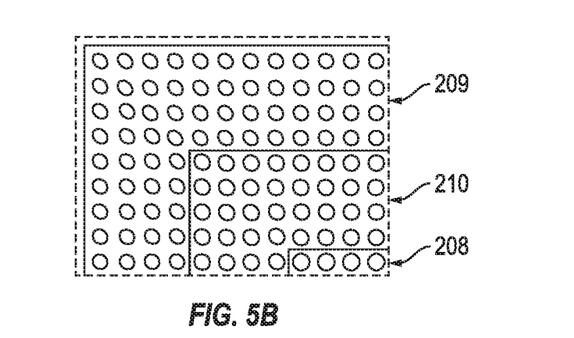

Furthermore, in one or more embodiments, the angles $\theta$ at which the vias 202 and the metallic interconnects 203 are slanted may vary between the vias 202 and the metallic interconnects 203 (e.g., the angles $\theta$ at which the vias 202 and the metallic interconnects 203 are slanted may vary across the interposer 200). For instance, in one or more embodiments, the angle $\theta$ at which the vias 202 and the metallic interconnects 203 are slanted may decrease in an outward direction away from the central portion 208 of the interposer substrate 201. The angles $\theta$ may decrease uniformly or non-uniformly. In one or more embodiments, the angles $\theta$ at which the vias 202 and the metallic interconnects 203 are slanted relative to the first surface 204 may decrease uniformly from approximately (about) 90 degrees at the central portion 208 of the interposer substrate 201 to approximately (about) 10 degrees at an outer portion 209 of the interposer substrate 201 proximate to the sidewalls 206, 207. For instance, FIGS. 5A-5B illustrate an embodiment of the interposer 200 in which the vias 202 and the corresponding metallic interconnects 203 in the central portion 208 (e.g., a square shaped central portion) of the interposer 200 are oriented at an angle $\theta$ of approximately (about) 90 degrees (e.g., orthogonal or substantially orthogonal) relative to the first surface 204, the vias 202 and the corresponding metallic interconnects 203 in an intermediate portion 210 (e.g., a square band) surrounding the central portion 208 of the interposer 200 are oriented at an angle $\theta$ of approximately (about) 40 degrees relative to the first surface 204, and the vias 202 and corresponding metallic interconnects 203 in the outer portion 209 (e.g., a square band) surrounding the intermediate portion 210 are oriented at an angle of approximately (about) 10 degrees relative to the first surface 204. In one or more embodiments, the angles $\theta$ at which the vias 202 and the metallic interconnects 203 are slanted relative to the first surface 204 are non-uniform within the vias 202 and the metallic interconnects 203 themselves (e.g., one or more vias 202 and corresponding metallic interconnects 203 may be curved). In one or more embodiments, the angles $\theta$ may increase or decrease non-uniformly. In one or more embodiments, the angles $\theta$ may increase or decrease in all three spatial directions (i.e., x-, y-, and z-directions). For instance, in one or more embodiments, the vias 202 and the metallic interconnects 203 may be spiral-wound and/or a derivate design.

Figure 2C:
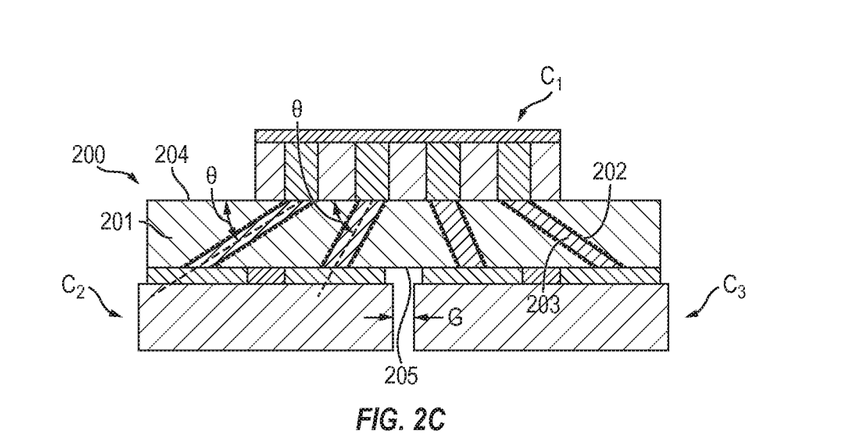
FIG. 2C is a side view of an interposer according to one embodiment of the present disclosure connecting a fine-pitch sensing array to two or more read-out integrated circuits (ROICs) separated by a gap.

With reference now to FIG. 2C, the interposer 200 may be utilized to connect a first chip $C_1$ (e.g., a sensing array) at the first surface 204 (e.g., the upper surface) to two or more chips $C_2$, $C_3$ (e.g., a series of ROICs tiled in an array) at the second surface 205. As illustrated in FIG. 2C, adjacent chips $C_2$, $C_3$ at the second surface 205 of the interposer 200 may be spaced apart by a gap G. In one or more embodiments, the angles $\theta$ of the vias 202 and the metallic interconnects 203 may decrease more rapidly at the gap or gaps G between adjacent chips $C_2$, $C_3$ (e.g., adjacent ROICs) connected to the second surface 205 of the interposer 200. In one or more embodiments, the angles $\theta$ of the vias 202 and the metallic interconnects 203 may decrease uniformly or substantially uniformly across the first and second chips $C_2$, $C_3$ (e.g., first and second ROICs), but the angles $\theta$ of the vias 202 and the metallic interconnects 203 may non-uniformly decrease at the gap G between the first and second chips $C_2$, $C_3$ to bridge the gap G between the adjacent chips $C_2$, $C_3$. (e.g., there may be a non-uniform step or jump in the angle $\theta$ of the vias 202 and the metallic interconnects 203 at the gap G). In one or more embodiments, changing the angles $\theta$ of the vias 202 and the metallic interconnects 203 at the gap G between the adjacent chips $C_2$, $C_3$ is configured to ensure that the first chip $C_1$ (e.g., the sensing array) is 100% addressable by the chips $C_2$, $C_3$ connected to the second surface 205 of the interposer 200.

In one or more embodiments, the vias 202 and the metallic interconnects 203 may have a diameter from approximately (about) 1 μm to approximately (about) 1000 μm. In one embodiments, one or more of the vias 202 and the metallic interconnects 203 may increase in diameter from the first surface 204 to the second surface 205 (e.g., at least via 202 and corresponding metallic interconnect 203 may have a first diameter at the first surface 204 of the interposer substrate 201 and a second diameter greater than the first diameter at the second surface 205 of the interposer substrate 201). In one or more embodiments, the second diameter of at least one via 202 and corresponding metallic interconnect 203 at the second surface 205 may be up to approximately (about) twice as large as the first diameter of the via 202 and corresponding metallic interconnect 203 at the first surface 204 of the interposer substrate 201. Additionally, in one or more embodiments, the diameters of the vias 202 and the corresponding metallic interconnects 203 may vary across the interposer substrate 201. In one or more embodiments, the diameters of the vias 202 and the corresponding metallic interconnects 203 may increase from approximately (about) 10% to approximately (about) 100% in outward direction away from the central portion 208 of the interposer substrate 201 (e.g., in a direction toward the sidewalls 206, 207).

Figure 3:
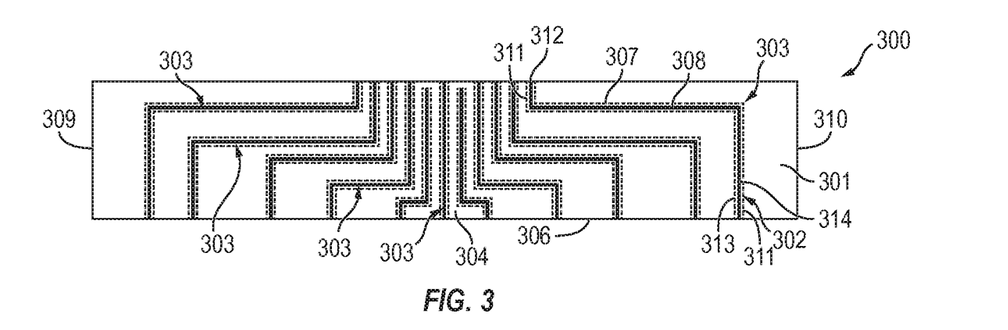
FIG. 3 is a side view of an interposer according to another embodiment of the present disclosure having vias and interconnects with sharp bends.

With reference now to FIG. 3, an interposer 300 according to another embodiment of the present disclosure includes an interposer substrate 301 defining a series of vias 302, and a series of metallic interconnects 303 in (e.g., extending through) the series of vias 302. In one or more embodiments, the interposer substrate 301 is formed from a dielectric material, such as, for instance, dielectric glass, ceramic, or polymer. In one or more embodiments, the interposer substrate 301 may have a thickness from approximately (about) 0.3 mm to approximately (about) 5 mm. In one or more embodiments, the interposer substrate 301 may have an area of approximately (about) 0.1 cm² to approximately (about) 150 cm². The metallic interconnects 303 may be formed of any material having suitable electrical conductivity, such as, for instance, highly conductive solders (e.g., tin-silver-copper), highly conductive brazes, silver-copper (Ag—Cu), or pure or substantially pure silver (Ag).

With continued reference to the embodiment illustrated in FIG. 3, at least one via 302 and corresponding metallic interconnect 303 in a center or central portion 304 of the interposer substrate 301 may be oriented at approximately (about) 90 degrees with respect to a first surface 305 (e.g., an upper surface) of the interposer substrate 301 (e.g., one or more vias 302 and one or more corresponding metallic interconnects 303 located in the center or central portion 304 of the interposer substrate 301 may be orthogonal or substantially orthogonal to the first surface 305). Additionally, in the illustrated embodiment, the vias 302 and metallic interconnects 303 outside (e.g., surrounding) the central portion 304 of the interposer substrate 301 each include a bend 307, 308, respectively, (e.g., a sharp bend) extending in an outward direction away from the central portion 304 of the interposer substrate 301 (e.g., extending toward one of the sidewalls 309, 310 of the interposer substrate 301). In the illustrated embodiment, the vias 302 and metallic interconnects 303 outside the central portion 304 each also include a first segment (e.g., an upper segment) 311, 312, respectively, extending from the bend 307, 308 to the first surface 305 and a second segment 313, 314 (e.g., a lower segment), respectively, extending from the bend 307, 308 to the second surface 306. In the embodiment illustrated in FIG. 3, the first segments 311, 312 are orthogonal or substantially orthogonal to the first surface 305, the second segments 313, 314 are orthogonal or substantially orthogonal to the second surface 306, and the bends 307, 308 are parallel or substantially parallel to the first and second surfaces 305, 306 of the interposer substrate 301.

In one or more embodiments, a length of the bends 307, 308 may vary between the vias 302 and the metallic interconnects 303. In the illustrated embodiment, the length of the bends 307, 308 may increase in an outward direction away from the central portion 304 of the interposer substrate 301. In one or more embodiments, the lengths of the first and second segments 311, 312, 313, 314 may vary between the vias 302 and the metallic interconnects 303. In the illustrated embodiments, the lengths of the first segments 311, 312 of the vias 302 and the metallic interconnects 303 decrease in the outward direction away from the central portion 304 of the interposer substrate 301, and the lengths of the second segments 313, 314 of the vias 302 and the metallic interconnects 303 increase in the outward direction away from the central portion 304 of the interposer substrate 301.

In the illustrated embodiment, the lengths of the bends 307, 308 of the vias 302 and the metallic interconnects 303 increase in the outward direction (e.g., increase in a direction toward vertical sidewalls 309, 310 of the interposer substrate 301) such that a first pitch of the vias 302 and the metallic interconnects 303 at the first surface 305 is smaller than a second pitch of the vias 302 and the metallic interconnects 303 at the second surface 306 (e.g., the spacing between adjacent vias 302 and adjacent metallic interconnects 303 is closer at the first surface 305 than at the second surface 306). In this manner, the vias 302 and the metallic interconnects 303 contained therein fan out from a relatively smaller-pitch at the first surface 305 to a relatively larger-pitch at the second surface 306 such that the interposer 300 may be utilized to connect chips having different pitches.

In one or more embodiments, the first and second segments 311, 312, 313, 314 and the bends 307, 308 of the vias 302 and the metallic interconnects 303 may have any other suitable orientations. FIGS. 4A-4D illustrate other suitable configurations of the vias 302 and the metallic interconnects 303 according to various embodiments of the present disclosure. In the embodiment illustrated in FIG. 4A, the first segments 311, 312 are slanted outward relative to the first surface 305 (e.g., angled outward toward vertical sidewalls 309, 310 of the interposer substrate 301), the second segments 313, 314 are orthogonal or substantially orthogonal to the second surface 306, and the bends 307, 308 are parallel or substantially parallel to the first and second surfaces 305, 306. The first segments 311, 312 may be slanted at any suitable angle θ relative to the first surface 305, such as, for instance, from approximately (about) 90 degrees to approximately (about) 10 degrees. Additionally, in one or more embodiments, the angle θ at which the upper segments 311, 312 are slanted relative to the first surface 305 may decrease in an outward direction away from the central portion 304 of the interposer substrate 301. In one or more embodiments, the length of the bends 307, 308 may increase in an outward direction away from the central portion 304 of the interposer substrate 301.

Figure 4A:
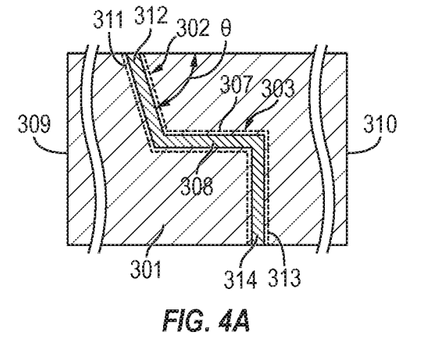
FIG. 4A-4D are side views of via and metallic interconnect configurations according to various embodiment of the present disclosure.
Figure 4B:
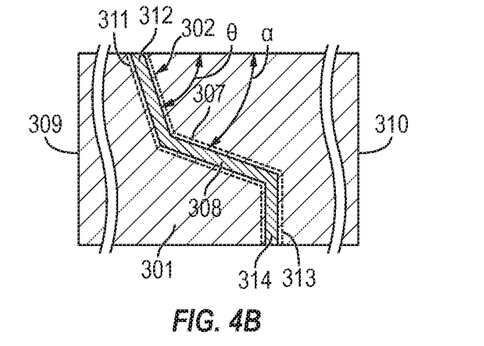

In the embodiment illustrated in FIG. 4B, the first segments 311, 312 are slanted outward relative to the first surface 305 (e.g., angled outward toward vertical sidewalls 309, 310 of the interposer substrate 301), the second segments 313, 314 are orthogonal or substantially orthogonal to the second surface 306, and the bends 307, 308 are slanted downward toward the second surface 306. The first segments 311, 312 may be slanted at any suitable angle θ relative to the first surface 305, such as, for instance, from approximately (about) 90 degrees to approximately (about) 10 degrees. The bends 307, 308 may be slanted downward at any suitable angle α relative to the first surface 305. Additionally, in one or more embodiments, the angle θ at which the first segments 311, 312 are slanted outward relative to the first surface 305 and/or the angle α at which the bends 307, 308 are slanted downward relative to the first surface 305 may decrease in an outward direction away from the central portion 304 of the interposer substrate 301. In one or more embodiments, the length of the bends 307, 308 may increase in an outward direction away from the central portion 304 of the interposer substrate 301.

Figure 4C:
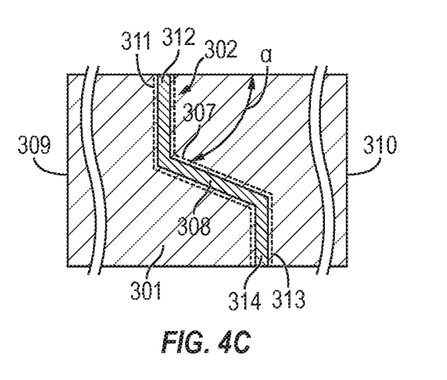

In the embodiment illustrated in FIG. 4C, the first segments 311, 312 are orthogonal or substantially orthogonal to the first surface 305, the second segments 313, 314 are orthogonal or substantially orthogonal to the second surface 306, and the bends 307, 308 are slanted downward toward the second surface 305. The bends 307, 308 may be slanted downward at any suitable angle α relative to the first surface 305. In one or more embodiments, the angle α at which the bends 307, 308 are slanted downward relative to the first surface 305 may decrease in an outward direction away from the central portion 304 of the interposer substrate 301. Additionally, in one or more embodiments, the length of the bends 307, 308 may increase in an outward direction away from the central portion 304 of the interposer substrate 301.

Figure 4D:
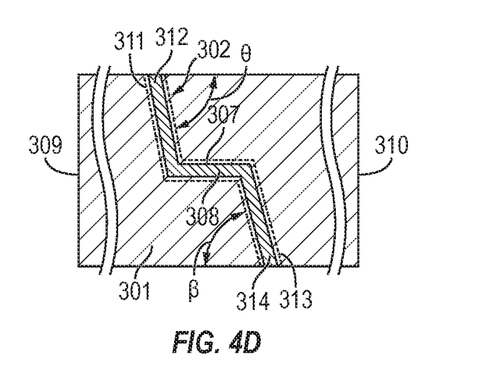

In the embodiment illustrated in FIG. 4D, the first segments 311, 312 are slanted outward relative to the first surface 305 (e.g., angled outward toward the vertical sidewalls 309, 310 of the interposer substrate 301), the second segments 313, 314 are slanted outward relative to the second surface 306 (e.g., angled outward toward the vertical sidewalls 309, 310 of the interposer substrate 301), and the bends 307, 308 are parallel or substantially parallel to the first and second surfaces 305, 306. The first segments 311, 312 may be slanted at any suitable angle θ relative to the first surface 305, such as, for instance, from approximately (about) 90 degrees to approximately (about) 10 degrees, and the second segments 313, 314 may be slanted at any suitable angle β relative to the second surface 306, such as, for instance, from approximately (about) 90 degrees to approximately (about) 10 degrees. Additionally, in one or more embodiments, the angle θ at which the first segments 311, 312 are slanted outward relative to the first surface 305 and/or the angle β at which the second segments 313, 314 are slanted relative to the second surface 306 may decrease in an outward direction away from the central portion 304 of the interposer substrate 301. In one or more embodiments, the length of the bends 307, 308 may increase in an outward direction away from the central portion 304 of the interposer substrate 301.

An interposer according to one embodiment of the present disclosure may include a combination of features of the embodiments of the interposers 200, 300 described above with reference to FIGS. 2A-4D. For instance, in one embodiment, an interposer may include a combination of slanted vias and metallic interconnects (e.g., as shown in FIGS. 2A-2C) and vias and metallic interconnects including a sharp bend (e.g., as shown in FIG. 3 and/or FIGS. 4A-4D). In one or more embodiments, the slanted vias and metallic interconnects may be located proximate to a central portion of the interposer and the vias and metallic interconnects including a sharp bend may be located outside (e.g., surrounding) the vias and metallic interconnects at the central portion to provide a greater extent of fan out.

Figure 6:
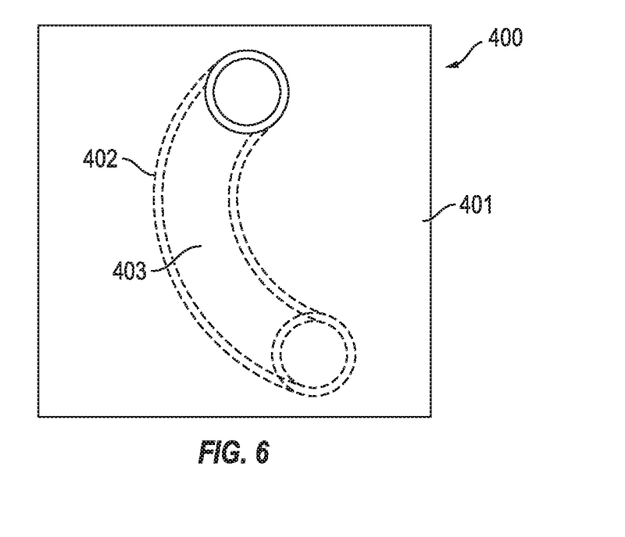
FIG. 6 is a detail view of an interposer according to another embodiment of the present disclosure having spiral-shaped vias and interconnects.

FIG. 6 depicts the configuration of an interposer 400 including an interposer substrate 401 defining a via 402 and a metallic interconnect 403 in the via 402 according to another embodiment of the present disclosure. As illustrated in FIG. 6, the via 402 and the corresponding metallic interconnect 403 are spiral-shaped. In the illustrated embodiment, the via 402 and the corresponding metallic interconnect 403 are a half-turn spiral, although in one or more embodiments the via 402 and the corresponding metallic interconnect 403 may be any other suitable proportion of a full-turn spiral, including a full-turn spiral. In one or more embodiments, the via 402 and the corresponding metallic interconnect 403 may include more than one full-turn spiral. For instance, in one or more embodiments, the via 402 and the interconnect 403 may include two or more full-turn spirals (e.g., multiple full-turn spirals). In one or more embodiments, the spirals of the via 402 and the corresponding metallic interconnect 403 may have non-uniform diameters (e.g., the spirals of the via 402 and the corresponding metallic interconnect 403 may increase or decrease in diameter).

Figure 7A:
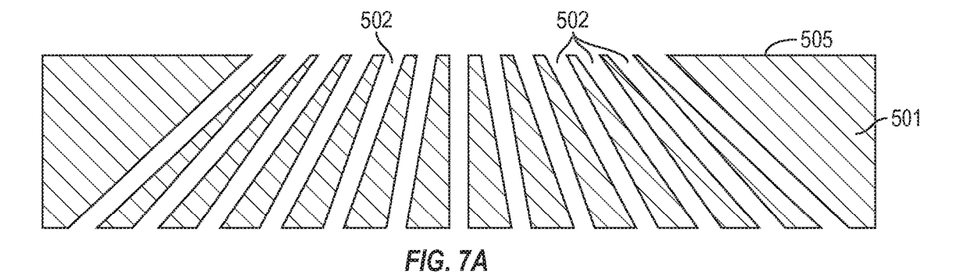
FIGS. 7A-7D illustrate tasks of a method of manufacturing an interposer according to one embodiment of the present disclosure.

FIGS. 7A-7D depict tasks of a method of manufacturing an interposer 500 according to one or more embodiments of the present disclosure. As illustrated in FIG. 7A, the method includes a task of forming an interposer substrate 501 defining a series of vias 502. The vias may have any suitable shape, size, and configuration, such as, for example, any of the shapes, sizes, and configurations described above with respect to the embodiments depicted in FIGS. 2A-6, or combinations thereof. In one or more embodiments, the task of forming the interposer substrate 501 with the series of vias 502 may include a task of 3-D printing the interposer substrate 501 from a pre-ceramic resin followed by a task of pyrolyzing the pre-ceramic resin to form an interposer substrate 501 formed of a dense glass ceramic material. In one or more embodiments, the task of forming the interposer substrate 501 may include a task of rinsing the 3-D printed interposer substrate 501 before the task of pyrolyzing the pre-ceramic resin. In one or more embodiments, during the task of pyrolyzing the pre-ceramic resin, the interposer substrate 501 shrinks in a linear dimension by approximately (about) 30%. The pre-ceramic resin may be any suitable type (or kind) of pre-ceramic resin. Suitable pre-ceramic polymer resins are described in U.S. application Ser. No. 15/406,762, filed Jan. 15, 2017 (published as U.S. Publication No. 2017/0204227), U.S. application Ser. No. 15/822,197, filed Nov. 26, 2017, U.S. application Ser. No. 15/822,199, filed Nov. 26, 2017, and U.S. application Ser. No. 15/822,203, filed on Nov. 26, 2017 (published as U.S. Publication No. 2018/0148585), the contents of all of which are incorporated herein in their entirety. In one or more embodiments, the task of forming the interposer substrate 501 may include a task of crystallizing the glass ceramic material of the interposer substrate 501 after the task of pyrolyzing the pre-ceramic resin (i.e., the method may include post-pyrolysis thermal crystallization of the glass ceramic material of the interposer substrate 501).

Figure 7B:
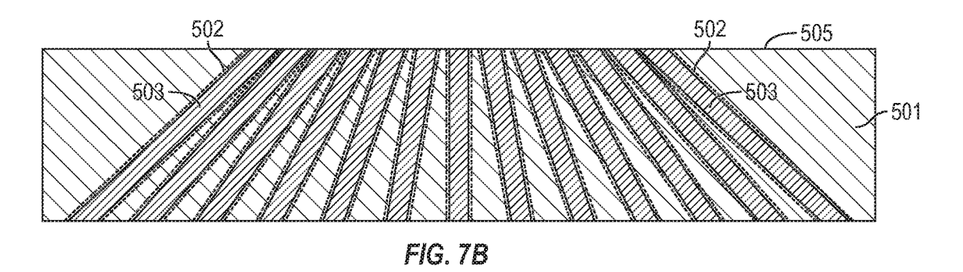

With reference now to FIG. 7B, the method also includes a task of forming metallic interconnects 503 in the vias 502 of the interposer substrate 501. In one or more embodiments, the task of forming the metallic interconnects 503 may include performing atomic layer deposition (ALD) of platinum (Pt) along inner circumferential surfaces of the vias 502 to form a thin layer of Pt on the vias 502, followed by electroless plating or electroplating of nickel (Ni) or copper (Cu) on the thin layer of Pt to completely fill the vias 502. In one embodiment, the task may include performing ALD to form a thin layer of Pt along the inner circumferential surfaces of the vias 502 having a thickness of approximately (about) 100 nm.

In one or more embodiments, the task of forming the metallic interconnects 503 may include performing metal melt infiltration of an electrically conductive material, such as a highly conductive solder (e.g., tin-silver-copper), a highly conductive braze, silver-copper (Ag—Cu) eutectic, or pure or substantially pure silver (Ag), into the vias 502 in the interposer substrate 501. In one embodiment, the task of forming the metallic interconnects 503 by metal melt infiltration includes heating the interposer substrate 501 (e.g., to approximately (about) 300° C.), applying a tin-silver-copper solder to the heated interposer substrate 501 to melt the tin-silver-copper solder, and applying pressure (e.g., mechanical pressure) to force the liquid tin-silver-copper solder into the vias 502. In one or more embodiments, the liquid tin-silver-copper solder does not wet the ceramic interposer substrate 501 and therefore the liquid solder does not flow into the vias 502 unless pressure is applied.

In one or more embodiments, the task of forming the metallic interconnects 503 may include a task of electroforming from a conductive substrate and/or a task of conductive paste infiltration (e.g., silver paste infiltration) into the vias 502.

In one or more embodiments, the method may include performing the tasks of forming the interposer substrate 501 and the task of forming the metallic interconnects 503 in the vias 502 simultaneously or substantially simultaneously (concurrently or substantially concurrently). In one embodiment, the method includes a task of forming the interposer substrate 501 and the metallic interconnects 503 simultaneously or concurrently by multi-material additive manufacturing during which the dielectric material of the interposer substrate 501 (e.g., polymer or dielectric glass) and the metal of the metallic interconnects 503 are deposited layer-by-layer. In one or more embodiments, the multi-material additive manufacturing process may include micro-extrusion of polymer and/or ceramic inks and/or pastes in parallel with the micro-extrusion of metal inks or pastes. In one or more embodiments, the multi-material additive manufacturing process may include aerosol jet printing and/or laser induced forward transfer (LIFT).

Figure 7C:
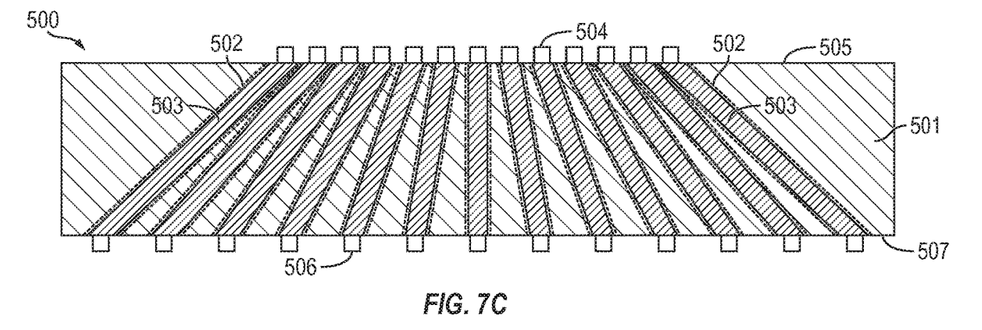

With reference now to FIG. 7C, the method may include a task of performing dual-sided bump microfabrication to form a first set of metal bumps 504 connected to the metallic interconnects 503 at a first side 505 (e.g., an upper side) of the interposer substrate 501 and to form a second set of metal bumps 506 connected to the metallic interconnects 503 at a second side 507 (e.g., a lower side) of the interposer substrate 501. The first and second sets of metal bumps 504, 506 protrude beyond (e.g., above and below) the first and second sides 505, 507, respectively, of the interposer substrate 501.

Figure 7D:
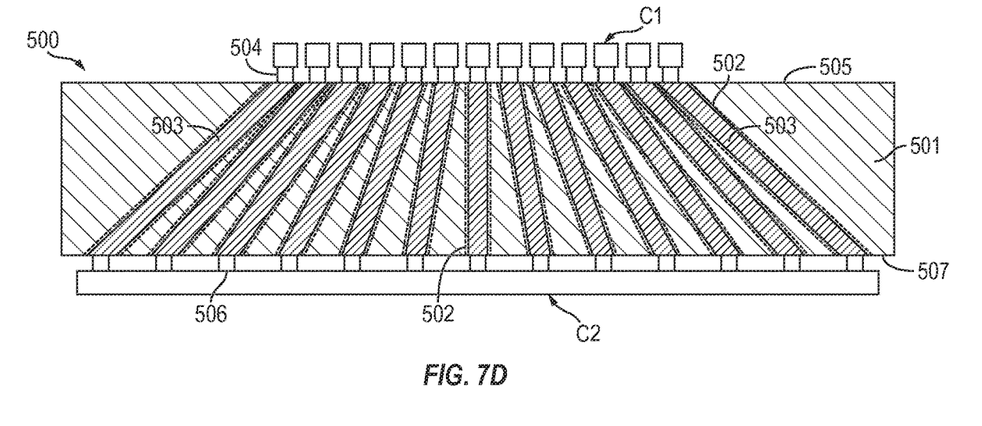

With reference now to FIG. 7D, the method may also include a task of performing dual-sided die bonding to connect a first chip $C_1$ (e.g., a sensor array, such as an infrared focal plane array (IR FPA), or a millimeter wave (mm-W) phased array) to the first set of metal bumps 504 at the first side 505 of the interposer substrate 501, and to connect at least one second chip $C_2$ (e.g., at least one ROIC or series of ROICs arranged in an array) to the second set of metal bumps 506 at the second side 507 of the interposer substrate 501 opposite the first side 505.

As illustrated in FIG. 7D, the configuration of the vias 502 and the metallic interconnects 503 (e.g., slanted vias and metallic interconnects, vias and metallic interconnects with bends, spiral-shaped vias and metallic interconnects, or combinations thereof) fan out from a relatively smaller-pitch at the first side 505 to a relatively larger-pitch at the second side 507 such that the interposer 500 may be utilized to connect chips $C_1$, $C_2$ having different pitches without the need for separate multi-layer interconnects, which are typically utilized in related art interposers.

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention. Although relative terms such as "inner," "outer," "upper," "lower," and similar terms have been used herein to describe a spatial relationship of one element to another, it is understood that these terms are intended to encompass different orientations of the various elements and components of the invention in addition to the orientation depicted in the figures. Additionally, as used herein, the term "substantially," "approximately," "about," and similar terms are used as terms of approximation and not as terms of degree, and are intended to account for the inherent deviations in measured or calculated values that would be recognized by those of ordinary skill in the art. Furthermore, as used herein, when a component is referred to as being "on" or "coupled to" another component, it can be directly on or attached to the other component or intervening components may be present therebetween. Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

What is claimed is:

1. An interposer, comprising:
    an interposer substrate comprising a plurality of vias, the interposer substrate having a first surface and a second surface opposite the first surface; and
    a plurality of metallic interconnects in the plurality of vias,
    wherein the interposer substrate comprises a dielectric material,
    wherein a first pitch of the plurality of vias at a first end of the plurality of vias is different than a second pitch of the plurality of vias at a second end of the plurality of vias,
    wherein the plurality of metallic interconnects are slanted at angles relative to the first surface of the interposer substrate,
    wherein the angles at which the plurality of metallic interconnects are slanted relative to the first surface of the interposer substrate varies between the plurality of metallic interconnects, and
    wherein the angle of at least one metallic interconnect of the plurality of metallic interconnects varies non-uniformly.

2. The interposer of claim 1, wherein the first pitch of the plurality of vias is at the first surface of the interposer substrate and the second pitch of the plurality of vias is at the second surface of the interposer substrate.

3. The interposer of claim 2, wherein:
    a first metallic interconnect of the plurality of metallic interconnects proximate to a center of the interposer substrate is oriented at an angle of about 90 degrees relative to the first surface, and
    a second metallic interconnect of the plurality of metallic interconnects comprises a bend at an intermediate position between the first and second surfaces of the interposer substrate, the bend extending in a direction away from the first metallic interconnect.

4. The interposer of claim 3, wherein the second metallic interconnect comprises a first segment extending from the first surface to the bend, and a second segment extending from the bend to the second surface.

5. The interposer of claim 4, wherein the first segment is substantially orthogonal to the first surface, and the second surface is substantially orthogonal to the second surface.

6. The interposer of claim 4, wherein the first segment is slanted relative to the first surface, or the second segment is slanted relative to the second surface.

7. The interposer of claim 3, wherein the bend is substantially parallel to the first and second surfaces.

8. The interposer of claim 1, wherein the angle of one metallic interconnect of the plurality of metallic interconnects proximate to a center of the interposer substrate is about 90 degrees.

9. The interposer of claim 8, wherein the angles of the plurality of metallic interconnects decrease with increasing distance from the center of the interposer substrate.

10. The interposer of claim 9, wherein the angles decrease non-uniformly.

11. The interposer of claim 1, wherein the interposer substrate has a thickness from about 0.3 mm to about 5 mm, and wherein a diameter of each of the plurality of metallic interconnects is from about 1 μm to about 1000 μm.

12. The interposer of claim 1, wherein the dielectric material of the interposer substrate is selected from the group of materials consisting of dielectric glass, ceramic, polymer, and combinations thereof.

13. An interposer, comprising:
   an interposer substrate comprising a plurality of vias, the interposer substrate having a first surface and a second surface opposite the first surface; and
   a plurality of metallic interconnects in the plurality of vias,
   wherein the interposer substrate comprises a dielectric material,
   wherein a first pitch of the plurality of vias at a first end of the plurality of vias is different than a second pitch of the plurality of vias at a second end of the plurality of vias, and
   wherein at least a portion of one metallic interconnect of the plurality of metallic interconnects is spiral-shaped.

14. An interposer, comprising:
   an interposer substrate comprising a plurality of vias, the interposer substrate having a first surface and a second surface opposite the first surface; and
   a plurality of metallic interconnects in the plurality of vias,
   wherein the interposer substrate comprises a dielectric material,
   wherein a first pitch of the plurality of vias at the first surface of the interposer substrate is different than a second pitch of the plurality of vias at the second surface of the interposer substrate, and
   wherein at least one of the plurality of metallic interconnects has a first diameter at the first surface and a second diameter greater than the first diameter at the second surface.

15. A method of manufacturing an interposer, the method comprising:
   forming an interposer substrate comprising a plurality of vias, the interposer substrate having a first surface and a second surface opposite the first surface; and
   forming a plurality of metallic interconnects,
      wherein the plurality of metallic interconnects are in the plurality of vias,
      wherein the interposer substrate comprises a dielectric material,
      wherein a first pitch of the plurality of vias at a first end of the plurality of vias is different than a second pitch of the plurality of vias at a second end of the plurality of vias, and
   wherein the forming the interposer substrate comprises three-dimensional printing the interposer substrate from a pre-ceramic polymer resin by stereolithography or digital light processing, and pyrolyzing the pre-ceramic polymer resin into a glass ceramic material.

16. The method of claim 15, wherein the first pitch of the plurality of vias is at the first surface of the interposer substrate and the second pitch of the plurality of vias is at the second surface of the interposer substrate.

17. The method of claim 15, wherein:
   forming the plurality of metallic interconnects comprises three-dimensional printing the plurality of metallic interconnects.

18. The method of claim 15, wherein the forming the plurality of metallic interconnects is performed by a process selected from the group of processes consisting of atomic layer deposition, electroless plating, electroplating, electroforming from a conductive substrate, injection of a metallic paste, metal melt infiltration, and combinations thereof.

19. The method of claim 15, wherein the forming the plurality of metallic interconnects comprises metal melt infiltration of a conductive material selected from the group consisting of solder, braze, Ag—Cu eutectic, pure silver, and combinations thereof.

20. The method of claim 15, A method of manufacturing an interposer, the method comprising:
   forming an interposer substrate comprising a plurality of vias, the interposer substrate having a first surface and a second surface opposite the first surface; and
   forming a plurality of metallic interconnects,
      wherein the plurality of metallic interconnects are in the plurality of vias,
      wherein the interposer substrate comprises a dielectric material,
      wherein a first pitch of the plurality of vias at a first end of the plurality of vias is different than a second pitch of the plurality of vias at a second end of the plurality of vias, and
   wherein the forming the interposer substrate and the forming the plurality of metallic interconnects are performed concurrently by a multi-material additive manufacturing process.

21. The method of claim 20, wherein the multi-material additive manufacturing process is selected from the group of processes consisting of micro-extrusion, aerosol jet printing, laser induced forward transfer, and combinations thereof.

* * * * *